Oct. 11, 1960 E. DURBIN 2,956,232

ELECTRONIC ENERGY STORAGE CIRCUITS

Filed May 16, 1956 2 Sheets-Sheet 1

INVENTOR
EDWARD DURBIN
BY R. V. Craddock
ATTORNEY

INVENTOR
EDWARD DURBIN
BY R. V. Craddock
ATTORNEY

United States Patent Office 2,956,232
Patented Oct. 11, 1960

2,956,232

ELECTRONIC ENERGY STORAGE CIRCUITS

Edward Durbin, Valley Stream, N.Y., assignor to Sperry Rand Corporation, a corporation of Delaware

Filed May 16, 1956, Ser. No. 587,189

3 Claims. (Cl. 328—40)

The present invention relates to energy storage circuits such as electronic pulse counting or frequency divider devices.

One type of device known in the art as a step by step counting circuit is comprised of an input capacitor, a first diode connected between the output side of said capacitor and ground, a second diode connected between an output terminal and the junction of said input capacitor with the first diode, the diodes being pulsed for current flow in opposite directions relative to said junction, and an output capacitor of appreciably larger capacitance than said input capacitor connected between said output terminal and ground. Such a circuit may be adapted to accurately count input pulses of one polarity by providing a step voltage change across the output capacitor for each input pulse, the step magnitude being a predetermined function of the amplitude of an input pulse.

It is sometimes desirable to feed a pulse counting circuit with an output waveform from a blocking oscillator. A pulse from a blocking oscillator has both negative and positive going excursions from a quiescent value. If a pulse counting circuit as aforedescribed is fed with blocking oscillator pulses, the magnitudes of the step voltage changes across the output capacitor will be functions of both amplitudes of the positive and negative going excursions of the blocking oscillator pulse. This can be objectionable since only the amplitude of the negative excursion of an output pulse at the plate of the blocking oscillator tube can be accurately controlled. The positive going overshoot of such a pulse is subject to variation with changes in tube characteristics and/or changes in the line or filament voltages applied to the oscillator.

If a step by step pulse counting circuit is fed by input pulses from a blocking oscillator and is utilized so that the voltage waveform across the output capacitor of the circuit will trigger a further blocking oscillator after recurrence of a certain number of input pulses, the step voltage changes across the output capacitor of the counting circuit must be very accurately controlled to prevent misfiring of the further oscillator. Since pulse counting circuits as aforedescribed are subject to variations in the peak to peak amplitudes of positive and negative going pulse excursions applied thereto, it is evident that the waveform across the output capacitor thereof may not be as accurate as desired and misfiring of the output oscillator might occur.

Therefore, it is an object of the present invention to provide an improved electronic energy storage circuit for producing an output waveform which is subject to change in response to input pulse excursions of only one polarity.

It is a further object to provide a step by step counting circuit for providing a highly accurate output waveform in response to pulses supplied thereto from a blocking oscillator.

It is yet another object of the present invention to provide a pulse counting circuit requiring only one instead of a multiple of unidirectional current devices.

The foregoing and other objects of the present invention are attained by the utilization of a circuit which is comprised of an input capacitor, an output capacitor across which a desired waveform is provided; and a unidirectional current device and resistor combination having a junction coupled to the input capacitor, one terminal coupled to the output capacitor and a further terminal coupled to ground. The magnitude of a step voltage change provided across the output capacitor is accurately related to an excursion in only one direction of an input pulse causing the unidirectional current device to become conductive, the magnitude of the output voltage waveform being substantially independent of an input pulse excursion in an opposite direction.

Referring to the drawings.

Figure 1:
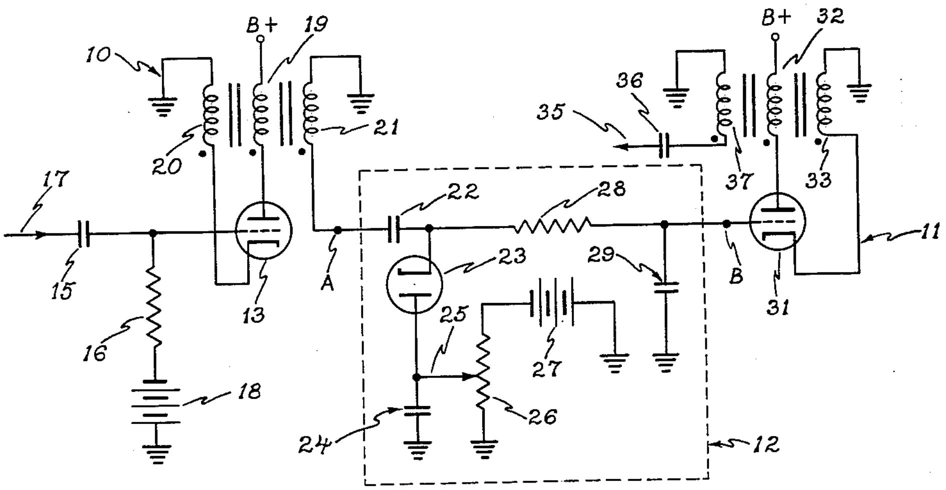
Fig. 1 is a schematic diagram of a pulse counting circuit in accordance with a first embodiment of the present invention.

Referring to Fig. 1, the numeral 10 designates a single swing input blocking oscillator with the numeral 11 representing a single swing output blocking oscillator utilization circuit. The components enclosed within the dotted line 12 comprise the energy storage or pulse counting circuit of the present invention having an input terminal at point A and an output terminal at point B.

The function of the energy storage circuit 12 is to provide an output voltage waveform which rises by a predetermined amount once each time a pulse from blocking oscillator 10 is supplied thereto. The blocking oscillator 11 is normally cut-off and is adapted to become conductive and produce an output voltage pulse after recurrence of a certain number of pulses supplied to the energy storage circuit 12. Although the blocking oscillator 10 is illustrated as a single swing driven oscillator requiring an input trigger to be supplied thereto for each firing thereof, a free running blocking oscillator might be employed in lieu thereof so that the complete system shown in Fig. 1 would function as a frequency divider.

The blocking oscillator 10 comprises a triode tube 13 having an R-C input coupling circuit comprising capacitor 15 and resistor 16 for supplying the grid of the tube 13 with positive input trigger pulses upon a lead 17 provided for coupling to an external pulse source, not shown. The resistor 16 is coupled to a negative terminal of a battery 18 for biasing the grid of oscillator tube 13 below cut-off in the absence of a trigger pulse.

A source of positive operating B+ potential is coupled to the plate of the tube 13 through a primary winding 19 of a blocking oscillator transformer. A secondary transformer winding 20 connected between the cathode of tube 13 and ground is provided for feeding back changes in the plate voltage of tube 13 to the cathode thereof. A further secondary transformer winding 21 connected between ground and the input to the energy storage circuit 12 is provided for obtaining output pulses from the blocking oscillator 10. The dots provided at various ends of the transformer windings 19 through 21 indicate that voltages at these ends will always be similar in polarity whenever there is a change in voltage across the primary winding 19. When triggered, the pulse voltage at the plate of oscillator tube 13 comprises a negative excursion immediately followed by a positive overshoot excursion.

The energy storage circuit 12 includes an input energy storage means comprising capacitor 22 in series with the output transformer winding 21 of blocking oscillator 10, and a diode 23 in shunt therewith. The cathode of diode 23 is connected to the capacitor 22 with the plate thereof being coupled to ground through a further capacitor 24 have a large capacitance such as one hundred times that of capacitor 22. The plate of the diode 23 is maintained at a negative potential, for reasons which will be later described, by connecting it to an adjustable contact arm 25 positioned at a point along a resistor 26 connected in series between the negative terminal of battery 27 and ground.

The circuit 12 is further comprised of a resistor 28 having one end thereof connected to the cathode of tube 23 with the other end thereof being coupled to ground through an output energy storage means comprising capacitor 29. Capacitor 29 may have a capacitance of the order of ten times that of capacitor 22, for example. The resistor 28 should have a suitable resistance value so that the time constant of the series R-C circuit comprising resistor 28 and capacitors 22, 29 controls the extent of the overshoot of an input pulse from oscillator 10 appearing across capacitor 29. If the time constant is made smaller than the duration of the overshoot, more of the overshoot appears across capacitor 29. The exact value of the tolerable overshoot is a function of the application of the circuit.

The aforementioned time constant of the circuit comprising components 22, 28 and 29 should not be as large as the spacing between the pulses provided by blocking oscillator 10, however, or the system will not function as desired. In one system which has been successfully operated the time constant of the circuit comprising resistor 28 and capacitors 22, 29 was just about equal to the duration of the positive overshoot of an output pulse at the plate of oscillator tube 13.

The output waveform of the circuit 12 is supplied to the grid of a triode tube 31 of the blocking oscillator 11. The plate of the tube 31 is connected to a positive source of B+ operating potential through a primary winding 32 of a blocking oscillator transformer. A secondary winding 33 of the aforementioned transformer is connected between ground and the cathode of tube 31 for feeding back changes in the plate voltage of tube 31 to the cathode thereof. A lead 35 and coupling capacitor 36 are connected to a secondary winding 37 for obtaining an output voltage. The dots at the ends of transformer windings 32, 33 and 37 are representative of similar polarities of voltages at these ends when there is a change in current flow through the winding 32.

The blocking oscillator tube 31 is cut off during quiescence by a negative charge on capacitor 29. Capacitor 29 is negatively charged during initial operation of the blocking oscillator tube 31 as when it is first turned on, a voltage is produced in the secondary winding 33 which drives the cathode in a negative direction. In effect, the grid is driven positive relative to the cathode of tube 31 and grid current flow is produced. This rapidly charges capacitor 29 until a negative voltage is provided across capacitor 29 which is substantially equal to the negative voltage at the plate of the diode tube 23. The position of contact arm 25 upon resistor 26 determines how far below cut off the tube 31 is held after its initial conducting state has expired.

In operation of the system as a pulse counter, whenever a positive input trigger pulse of magnitude large enough to drive tube 13 above cut off appears upon input lead 17, an output pulse having a negative excursion followed by a positive overshoot excursion is provided at the plate of the tube 13 in a manner typical of a blocking oscillator. Each pulse is reproduced across transformer winding 21 for reference to ground, trigger pulses supplied to lead 17 being represented in Fig. 2 with the waveform developed across transformer winding 21 being shown in Fig. 3. If desired, the transformer winding 21 might be omitted and the pulses supplied to circuit 12 could be obtained directly from the plate of tube 13.

Figures 2, 3, 4:
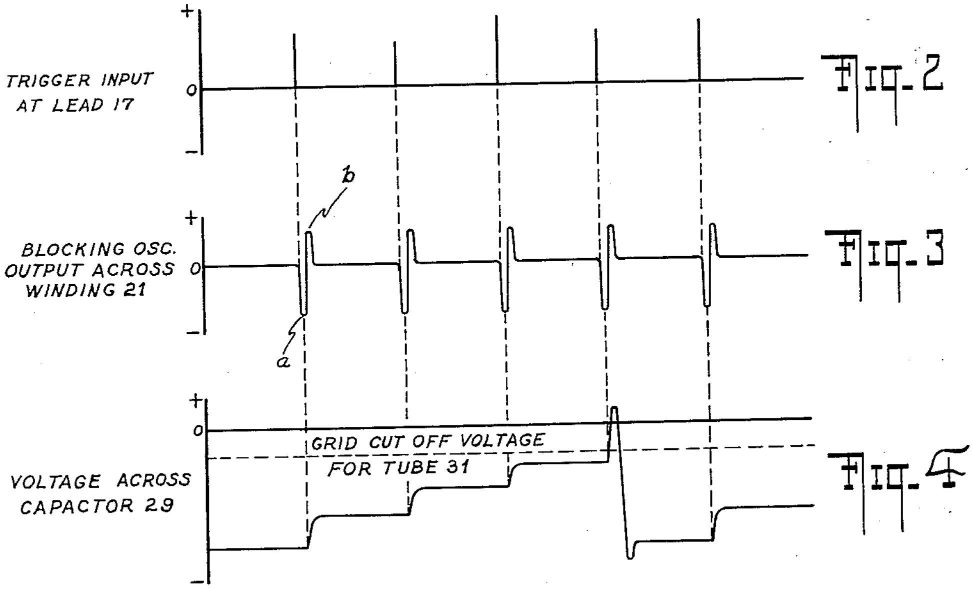
Figs. 2 through 4 are diagrams of various waveforms which would appear at different points in the circuit illustrated in Fig. 1 during operation thereof.

The negative excursion of each pulse of the waveform shown in Fig. 3 can be made to have a constant amplitude and duration each time the tube 13 is fired. This will be the case even if the amplitude and/or duration of an input trigger pulse were to change, provided an input trigger was large enough to fire tube 13. However aging of the tube 13 and/or changes in filament voltage therefor might cause the positive excursion of a blocking oscillator pulse to be different from time to time. It will be seen that this will have no undesirable effect on the waveform provided across capacitor 29 at the output of energy storage circuit 12.

Diode 23 becomes conductive upon commencement of the negative excursion of a pulse across transformer winding 21 so as to provide a low resistance path through the diode and capacitor 24 for rapidly charging capacitor 22 to a different voltage from that across the capacitor 22 before the pulse was applied. The charging time of capacitor 22 via capacitor 24 and diode 23 should be negligible relative to the duration of the negative pulse excursion so that the change in charge of capacitor 22 is substantially complete in the immediate vicinity of point "*a*" on the first pulse shown in Fig. 3. The magnitude of the change in charge of capacitor 22 is a function of the negative peak amplitude of point "*a*." There is no change in charge across capacitor 29 in this time.

As the pulse across transformer winding 21 begins to rise from point "*a*" as shown in Fig. 3 to a positive peak at point "*b*" in Fig. 3, the diode 23 will no longer be conductive. Thus, the charge accumulated by capacitor 22 in response to the leading negative going portion of the blocking oscillator pulse begins to be redistributed between capacitors 22 and 29 through the resistor 28, capacitors 22 and 29 and resistor 28 comprising a series charging circuit. The aforementioned redistribution of charge causes the voltage across the capacitor 29 to rise in step fashion as shown in Fig. 4, and is completed before the next blocking oscillator pulse is applied. The charges of both capacitors 22 and 29 after occurrence of a pulse from oscillator 10 are functions of the amplitude of the negative excursion of the pulse from oscillator 10. If the time constant of the series circuit comprised of components 22, 28 and 29 is of the order of the positive pulse excursion from blocking oscillator 10, the positive excursion of a blocking oscillator pulse will have substantially no effect upon the charge upon capacitor 29 except to cause the voltage thereacross to rise at a more rapid rate for an initial time during the rise thereof to a value determined only by the initial change in charge across the capacitor 22 by the amplitude of the negative excursion of the blocking oscillator pulse.

If the time constant of the circuit 22, 28, 29 is increased, the initial rise in voltage across capacitor 29 is more gradual while a decrease in said time constant causes the rise to be more abrupt. Care must be taken that this time constant is not too much smaller than the duration of the positive overshoot of a pulse from oscillator 10, however, or the magnitude of the peak voltage change across capacitor 29 will also become a function of the positive as well as the negative excursion of a blocking oscillator pulse. Choice of this time constant is controlled by the resistance value of resistor 28 and is dependent on the specifications of the particular system with which the pulse counting circuit is employed.

The magnitude of the resultant step voltage change across capacitor 29 in response to the leading edge of each negative pulse excursion becomes exponentially less for each succeeding pulse across transformer winding 21. After a certain number of step voltage changes across capacitor 29 such as three or four, the grid voltage of the tube 31 is driven above cut off so that the blocking oscillator tube 31 fires and an output pulse is provided. Since the position of contact arm 25 upon resistor 26 regulates the magnitude of the negative voltage at the grid of tube 31 before occurrence of any pulses at terminal A, it also effectively determines how many step voltage rises must occur across capacitor 29 before tube 31 will be triggered.

During the firing interval of the tube 31 the capacitors 22 and 29 are recharged to an original value determined by the position of contact arm 25 upon the resistor 26 and the voltage at the cathode of the diode tube 23. Thus, the action of the circuit will be repeated for succeeding pulses produced by the blocking oscillator 10 so that the blocking oscillator 11 will produce one output pulse immediately upon recurrence of a certain number of input pulses to the counting circuit 12 from the blocking oscillator circuit 10.

The foregoing pulse counting circuit illustrated in Fig. 1 is of a type which is responsive to negative pulse excursions regardless of positive pulse excursions which might also occur. The output waveform across capacitor 29 is in the form of steps which rise in a positive direction with one step for each negative pulse excursion. If for some reason it is desired that the circuit be responsive to positive pulse excursions for producing an output waveform where steps fall in a negative direction, the circuit illustrated in Fig. 1 could be readily modified by reversing the polarity of the diode 23 from that shown in Fig. 1. Such a circuit would not be employed to trigger a blocking oscillator 11 in the manner shown in Fig. 1, however, and the battery 27 would be omitted.

Figure 5:
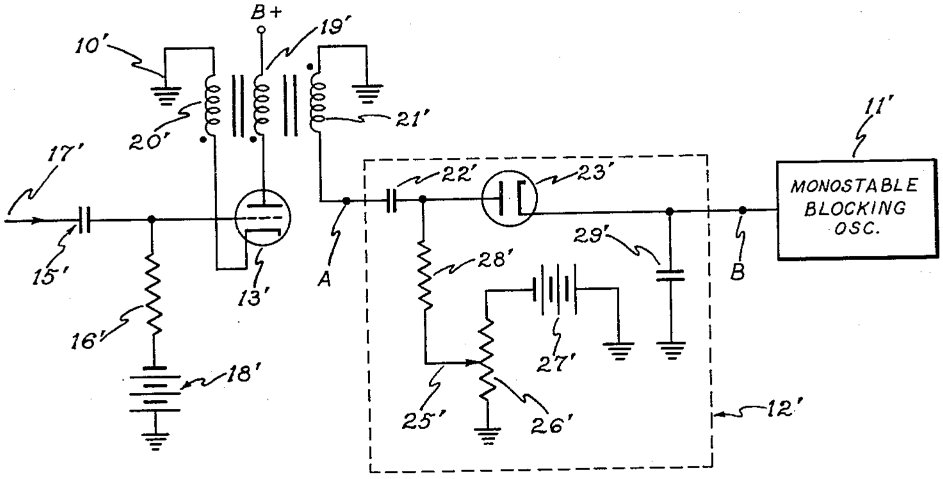
Fig. 5 is a schematic diagram of a pulse counting circuit in accordance with another embodiment of the present invention.

A slightly different arrangement from that shown in Fig. 1 for producing an output waveform whose steps rise in a positive direction in response to positive excursions of an input pulse is illustrated in Fig. 5. In this embodiment the components corresponding to similar components in Fig. 1 are referred to by primed reference numerals. The circuit in Fig. 5 is different from that in Fig. 1 in that the direction of the transformer winding 21' is reversed compared to that of winding 21 in Fig. 1. Furthermore, the diode 23' is inserted in series with the capacitor 22' rather than in shunt therewith as in Fig. 1, with the resistor 28' being provided in shunt with the capacitor 22' instead of in series therewith as is the resistor 28 in Fig. 1. The capacitor 24 in Fig. 1 may be omitted in the circuit of Fig. 5.

Figures 6, 7:
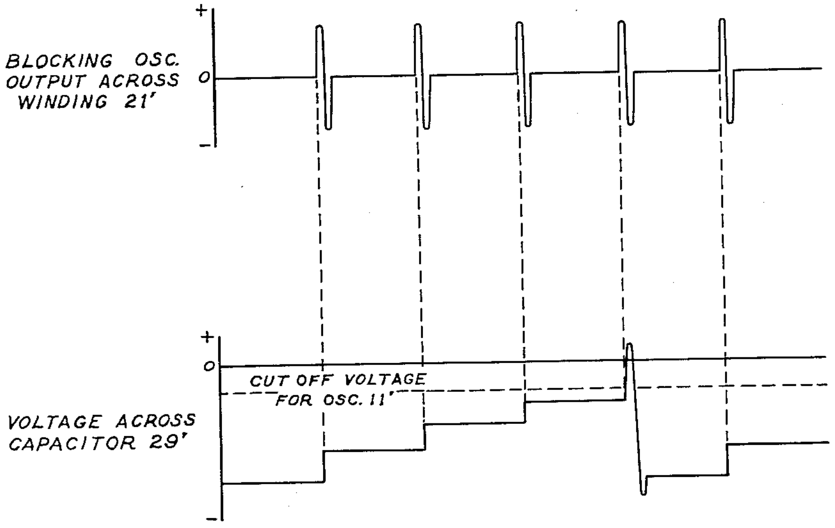
Figs. 6 and 7 are diagrams of various waveforms which appear at different points in the circuit illustrated in Fig. 5 during the operation thereof.

In operation of the system shown in Fig. 5, an output pulse from the blocking oscillator 10' is inverted by transformer winding 21' and is supplied to the input terminal A of the circuit 12' as a positive followed by a negative pulse excursion as shown in Fig. 6. As the voltage at terminal A in Fig. 5 rises in a positive direction, the capacitors 22' and 29' are immediately charged through diode 23' by amounts which are functions of the positive peak amplitude of the pulse and the relative magnitudes of capacitors 22' and 29'. Capacitor 29' should have an appreciably higher capacitance than capacitor 22' as before.

When the voltage at terminal A in Fig. 5 reaches the peak of each positive pulse excursion and starts to go negative, the diode 23' cannot conduct and capacitor 22' starts to discharge through the resistors 28' and 26', capacitor 29' retaining its charge since there is no discharge path therefor. Capacitor 22' is discharged after the peak amplitudes of each positive pulse excursion until the voltage stored thereby reaches the value of that at the junction of arm 25' and resistor 26', the negative excursion of an input pulse momentarily increasing the rate of the discharge at the beginning thereof. This has no effect on the charge of capacitor 29' since diode 23' is nonconductive for negative excursions at its plate. The resistors 28' and 26' should have a total resistance considerably larger than that of diode 23' but not so large that the charge accumulated upon capacitor 22' with the positive pulse excursions applied thereto cannot be discharged from capacitor 22' before the occurrence of another input pulse at the terminal A.

Each succeeding positive pulse excursion applied to terminal A causes the voltage across capacitor 29' to rise stepwise as shown in Fig. 7, the steps having amplitudes whose values decrease exponentially. Thus, it can be seen that the circuit of Fig. 5 can also be used as a pulse counting circuit which triggers the output blocking oscillator 11' after a certain number of input pulses at terminal A have occurred. If it is desired to utilize a circuit such as 12' for response to negative pulse excursions so as to produce negative going rather than positive going steps across the capacitor 29', the polarity of the diode 23' can be reversed and battery 27' omitted.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In combination, an input terminal and an output terminal, a first capacitor and a resistor connected in series between said input and output terminals, said resistor having substantially the same resistance value for current flow in either direction therethrough, a second capacitor connected between said output terminal and ground, said second capacitor having a value of capacitance which is appreciably larger than that of said first capacitor, a unidirectional coupling device having cathode and plate electrodes, means connecting one of said electrodes to a point between said first capacitor and said resistor, means connecting the other of said electrodes to ground, and means coupled between said input terminal and ground for supplying a series of recurrent pulses each having an initial excursion of one polarity followed by an overshoot excursion of opposite polarity, the time intervals between said pulses being appreciably longer than the durations of said pulses, the initial excursion of each of said pulses being of predetermined polarity for operation of said coupling device in a conductive state to thereby rapidly charge said first capacitor through said coupling device in response to said initial excursion of said one polarity, the charging time being negligible relative to the duration of the initial excursion of each of said pulses, the time constant of said resistor and capacitors as a series circuit being approximately equal to the duration of the overshoot excursion of each of said pulses, whereby the charge upon said first capacitor is redistributed between said first and second capacitors through said resistor following the peak of the initial excursion of each pulse, the charge of said second capacitor being substantially independent of the magnitude of the overshoot excursion of each of said pulses.

2. The combination as set forth in claim 1, wherein the cathode of said unidirectional coupling device is connected to said point between said first capacitor and said resistor, the plate of said coupling device being connected to ground, the initial excursion of each of said pulses being of negative polarity with respect to ground.

3. The combination as set forth in claim 2, further including a monostable blocking oscillator tube having a cathode connected to ground, said tube having a grid connected to said output terminal at said second capacitor, a source of unidirectional potential having a negative terminal and a positive terminal, means connecting said positive terminal to ground, and means connecting said negative terminal to the plate of said unidirectional coupling device for biasing said blocking oscillator tube below cut-off until the voltage across said second capacitor rises above cut-off for said tube in response to a predetermined number of said recurrent pulses.

References Cited in the file of this patent

UNITED STATES PATENTS

| | | |
|---|---|---|
| 2,411,573 | Holst | Nov. 30, 1944 |
| 2,415,567 | Schoenfeld | Feb. 11, 1947 |
| 2,495,726 | Houghton et al. | Jan. 31, 1950 |
| 2,583,003 | Mayle | Jan. 22, 1952 |
| 2,589,270 | Mayle | Mar. 18, 1952 |
| 2,711,549 | Viterisi | Nov. 20, 1956 |